United States Patent [19]
Sawasaki et al.

[11] Patent Number: 5,859,171
[45] Date of Patent: Jan. 12, 1999

[54] POLYIMIDE COPOLYMER, POLYIMIDE COPOLYMER RESIN MOLDED PRODUCTS AND THEIR PREPARATION

[75] Inventors: Kouichi Sawasaki; Michihiro Kubo, both of Aichi; Toshikazu Matsuda, Shiga, all of Japan

[73] Assignee: DuPont Toray, Tokyo, Japan

[21] Appl. No.: 859,899

[22] Filed: May 21, 1997

[51] Int. Cl.$^6$ .................................................... C08G 63/02
[52] U.S. Cl. ......................... 528/183; 528/176; 528/185; 528/187
[58] Field of Search .................................. 528/176, 183, 528/185, 187

[56] References Cited

U.S. PATENT DOCUMENTS

| | | | |
|---|---|---|---|
| 4,535,105 | 8/1985 | Inaike et al. | 524/104 |
| 4,779,872 | 10/1988 | Sasaki et al. | 528/176 |

FOREIGN PATENT DOCUMENTS

| | | |
|---|---|---|
| 0 189 643 A2 | 8/1986 | European Pat. Off. |
| 0 276 405 A2 | 8/1988 | European Pat. Off. |
| 0 455 208 A2 | 11/1991 | European Pat. Off. |
| 0 491 307 A | 6/1992 | European Pat. Off. |
| 59-164328 | 9/1984 | Japan |
| 64-16832 | 1/1989 | Japan |
| 64-16833 | 1/1989 | Japan |
| 64-16834 | 1/1989 | Japan |
| 1-131241 | 5/1989 | Japan |
| 1-131242 | 5/1989 | Japan |
| 5-25273 | 2/1993 | Japan |
| 6-210629 | 8/1994 | Japan |

OTHER PUBLICATIONS

Patent Abstracts of Japan, vol. 014, No. 446, 25 Sep. 1990 & JP 02 175772 A (Sumitomo Bakelite Co Ltd), 9 Jul. 1990, Abstract.

Patent Abstracts of Japan, vol. 016, No. 144, 10 Apr. 1992 & JP 04 004231 A (Sumitomo Bakelite Co Ltd), 8 Jan. 1992, Abstract.

Database WPI, Section CH, Week 9516, Derwent Publications Ltd., London, GB; Class A26, AN 95–118748 –XP002047778 & JP 07 041 558 A (Kanebuchi Kagaku Kogyo KK), 10 Feb. 1995.

*Primary Examiner*—Terressa Mosley

[57] ABSTRACT

A polyimide copolymer containing a block polyimide polymer component composed of a rigid aromatic diamine compound and an aromatic tetracarboxylic acid compound and a random polyimide copolymer component composed of a flexible aromatic diamine compound and at least two types of aromatic tetracarboxylic acid compounds is prepared by a two-stage polymerization process. Resin molded products prepared from the polyimide copolymer have high modulus, low thermal expansion and low water absorption and can be used as TAB base films that require higher processability and precision.

18 Claims, No Drawings

POLYIMIDE COPOLYMER, POLYIMIDE COPOLYMER RESIN MOLDED PRODUCTS AND THEIR PREPARATION

FIELD OF THE INVENTION

The present invention relates to a polyimide copolymer that has high elasticity, low thermal expansion equivalent to that of metal and low water absorption, polyimide copolymer resin molded products and their preparation.

DESCRIPTION OF THE PRIOR ART

A polyimide obtained by the polycondensation of pyromellitic dianhydride and 4,4'-diaminodiphenyl ether is used for electrical parts employed in high temperature environments because it has excellent heat resistance and electrical insulating properties. Films of this polyimide are also used for flexible printed substrates due to their dimensional stability. They have also recently been used as base films for TAB (tape automated bonding) tape used to mount IC and LSI where higher processability and precision are required. In addition, high modulus of elasticity, low thermal expansion equivalent to that of metal and low moisture absorption are required as properties of the polyimide. Various studies have been conducted to obtain polyimides of this type. For example, Japanese Kokai Patent Nos. Sho 60-210629, Sho 64-16832, Sho 64-16833, Sho 64-16834, Hei 1-131241 and Hei 1-131242 disclose examples of three-component polyimides of pyromellitic dianhydride, 4,4'-diaminodiphenyl ether, and p-phenylenediamine that use p-phenylenediamine in combination with the 4,4'-diaminodiphenyl ether as the diamine component to increase the modulus.

Four-component polyimides that add 3,3',4,4'-biphenyltetracarboxylic dianhydride to the aforementioned three-component system are also known which further raise the modulus. For example, Japanese Kokai Patent Nos. Sho 59-164328 and Sho 61-111359 disclose examples of such four-component polyimides. Japanese Kokai Patent No. 5-25273 also discloses a four-component polyimide having improved properties obtained by controlling the monomer addition order during polymerization.

Use in TAB applications requires high modulus, low thermal expansion equivalent to that of metal and low water-absorptivity, as mentioned above. Even though the three-component polyimides obtained in Japanese Kokai Patent Nos. Sho 60-210629, Sho 64-16832, Sho 64-16833, Sho 64-16834, Hei 1-131241 and Hei 1-131242 have higher modulus than a polyimide obtained from pyromellitic dianhydride and 4,4'-diaminodiphenyl ether, satisfactory modulus for use in TAB applications is still not obtained. The four-component polyimides obtained in Japanese Kokai Patent Nos. Sho 59-164328 and Sho 61-111359 require a large amount of p-phenylenediamine to obtain sufficient modulus for TAB applications. However, the thermal expansion becomes much lower than that of metal. The four-component polyimide of Japanese Kokai Patent No. Hei 5-25273 has satisfactory modulus and thermal expansiveness for use in TAB applications but the water absorption remains a major problem.

Therefore, the object of the present invention is to provide a polyimide copolymer that has high modulus, low thermal expansion equivalent to that of metal and low water absorption, polyimide copolymer resin molded products and their preparation.

SUMMARY OF THE INVENTION

The present invention provides a polyimide copolymer and polyimide copolymer resin molded product, comprising a block polyimide component formed from a rigid aromatic diamine compound and an aromatic tetracarboxylic acid compound and a random polyimide copolymer component formed from a flexible aromatic diamine compound and at least two different aromatic tetracarboxylic acid compounds.

The present invention also provides a process for preparing a polyimide copolymer and a polyimide copolymer resin molded product which comprises (1) mixing a rigid aromatic diamine compound and an aromatic tetracarboxylic acid compound for a time necessary for completion of the reaction in such a ratio that the aromatic tetracarboxylic acid compound comprises 90 mole % to not more than 100 mole % of the reactants; (2) adding a flexible aromatic diamine compound; (3) adding an aromatic tetracarboxylic acid compound (A) and an aromatic tetracarboxylic acid compound (B; A≠B) in such a quantity that the total amount of aromatic tetracarboxylic acid component and total amount of aromatic diamine component are essentially equimolar and stirring for a time necessary for completion of the reaction; and (4) cyclizing and removing the solvent from the polyamide acid copolymer.

DETAILED DESCRIPTION OF THE INVENTION

The block polyimide component of the polyimide copolymer of the present invention has a repeating polyimide molecular chain formed from a rigid aromatic diamine compound and an aromatic tetracarboxylic acid compound, obtained by formation in the first stage of polymerization. The random polyimide copolymer component is formed by reacting a flexible aromatic diamine compound and at least two different aromatic tetracarboxylic acid compounds in the second stage of polymerization. The polyimide copolymer is formed by molecular bonding of the block polyimide component and the random polyimide copolymer block polyimide component and has excellent properties such as high modulus, low thermal expansion equivalent to that of metal and low water absorption.

Examples of rigid aromatic di amine compounds that can be used in the present invention include compounds represented by formula (I):

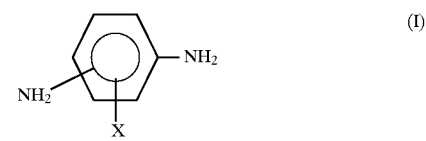

wherein X is a monovalent substituent selected from hydrogen, halogen, carboxyl, lower alkyl and lower alkoxy groups, wherein alkyl or alkoxy contains from 1 to 4 carbon atoms.

The use of phenylenediamine compounds a s the rigid aromatic diamine compound represented by formula (I) is preferred to increase the modulus of the molded products obtained. p-Phenylenediamine is especially preferred.

Compounds represented by formula (II) can be used as flexible aromatic diamine compounds in the present invention:

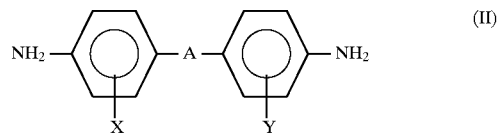

wherein X and Y are monovalent substituents selected from hydrogen, halogen, carboxyl, lower alkyl and lower alkoxy groups, X and Y may be the same or different substituents and A is a bivalent connecting group such as, —O—, —S—, —CO—, —SO—, —SO$_2$— and —CH$_2$—, wherein alkyl or alkoxy contains from 1 to 4 carbon atoms.

Aromatic diamine compounds containing no substituents other than amino groups as represented by the formula (III) are preferred among the flexible aromatic diamine compounds represented by formula (II) for increasing the formability of the molded products obtained:

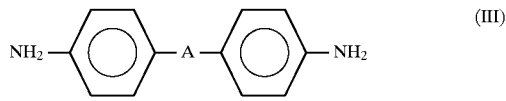
(III)

wherein A is bivalent connecting group selected from —O—, —S—, —CO—, —SO—, —SO$_2$— and —CH$_2$—. The use of 4,4'-diaminodiphenyl e the r is especially preferred.

The rigid aromatic diamine compound comprises from 12 mole % to 30 mole % and the flexible aromatic diamine compound comprises from 70 mole % to 88 mole % of the total amount of aromatic diamine component. The modulus of the polyimide copolymer molded product obtained decreases and the thermal expansion coefficient increases, which is undesirable, when the proportion of rigid aromatic diamine compound used is less than 12 mole % and the proportion of flexible aromatic diamine compound is more than 88 mole %. The water absorption of the polyimide copolymer molded product increases, the thermal expansion coefficient drops excessively, and the modulus rises excessively, thereby harming the moldability, when the proportion of rigid aromatic diamine compound is greater than 30 mole % and the proportion of flexible aromatic diamine compound is less than 70 mole %.

It is preferred to select from pyromellitic acid compounds, 3,3',4,4'-biphenyltetracarboxylic acid compounds and 3,3', 4,4'-benzophenone-tetracarboxylic acid compounds as the aromatic tetracarboxylic acid compounds, used in the invention. As examples of aromatic tetracarboxylic acid compounds, pyromellitic acid compounds include pyromellitic acid and the dianhydride thereof, 3,3',4,4'-biphenyltetracarboxylic acid compounds include 3,3',4,4'-biphenyltetracarboxylic acid and the dianhydride thereof, 3,3',4,4'-benzo-phenonetetracarboxylic acid compounds include 3,3',4,4'-benzophenonetetracarboxylic acid and the dianhydride thereof.

As to the proportions of aromatic tetracarboxylic acid compounds used in the invention, pyromellitic acid or dianhydride comprises from 50 mole % to 80 mole % and 3,3',4,4'-biphenyltetracarboxylic acid or dianhydride and/or 3,3',4,4'-benzophenonetetracarboxylic acid or dianhydride comprise from 20 mole % to 50 mole % of the total amount of the aromatic tetracarboxylic acid component. The modulus of the polyimide copolymer molded product obtained decreases and the water absorption increases, which is undesirable, when the proportion of 3,3',4,4'-biphenyltetracarboxylic acid or dianhydride and/or 3,3',4,4'-benzophenonetetra-carboxylic acid or dianhydride is less 20 mole %. The vapor permeability of the polyimide copolymer obtained deteriorates, air bubbles develop on the surface of the molded product, and the adhesive strength of the molded product decreases, which is undesirable, when the proportion of 3,3',4,4'-biphenyltetracarboxylic acid or dianhydride and/or 3,3',4,4'-benzo-phenonetetra-carboxylic acid or dianhydride is more than 50 mole %. The 3,3',4,4'-biphenyltetracarboxylic acid or dianhydride and 3,3',4,4'-benzophenone-tetracarboxylic acid or dianhydride may be used individually or in combination.

The process for preparing the polyimide copolymer of the present invention comprises first forming the block polyimide component in the first stage of polymerization by mixing one type of aromatic tetracarboxylic acid compound in a ratio of from 90 mole % to not more than 100 mole % in relation to the rigid aromatic diamine compound for at least I hour in an organic solvent that is nonreactive to the reactants.

Next, after adding the flexible aromatic diamine component, aromatic tetracarboxylic acid or dianhydride (A) is added and stirring continued for at least 1 hour. Aromatic tetracarboxylic acid or dianhydride (B; A≠B) is then added in a quantity such that the total amount of aromatic tetracarboxylic acid component and the total amount of aromatic diamine component are basically equimolar and stirred for I hour in the second stage of polymerization to form the random polyimide copolymer component. Polyamide acid copolymer solution which is a precursor is first obtained by this polymerization sequence. Polyamide acid copolymer solution, formed by molecular bonding of the block polyamide acid polymer component and the random polyamide acid copolymer component formed respectively in the first and second stages of the polymerization conducted consecutively with an excess of aromatic diamine component, is obtained. The desired polyimide copolymer can be obtained by cyclization and solvent removal from the polyamide acid copolymer solution.

Pyromellitic acid or dianhydride, 3,3',4,4'-biphenyltetracarboxylic acid or dianhydride and 3,3',4,4'-benzophenonetetracarboxylic acid or dianhydride may be used individually as aromatic tetracarboxylic acids in the first stage of the polymerization process. However, the use of pyromellitic acid or dianhydride is preferred to increase the modulus of the polyimide copolymer molded products obtained. As the aromatic diamine component, a rigid aromatic diamine compound is used.

Any combination of pyromellitic acid or dianhydride, 3,3',4,4'-biphenyl-tetracarboxylic acid or dianhydride and 3,3',4,4'-benzophenonetetracarboxylic acid or dianhydride is preferably used as the aromatic tetracarboxylic acid component in the second stage of polymerization. Use of a combination of pyromellitic acid or dianhydride and 3,3',4, 4'-biphenyltetracarboxylic acid or dianhydride is preferred to increase the modulus of the polyimide copolymer molded products obtained. As the aromatic diamine component, a flexible aromatic diamine compound is used.

Examples of the solvent used in the process include dimethylsulfoxide, N,N-dimethylacetamide, N,N-diethylacetamide, N,N-dimethylformamide, N,N-diethylformamide, N-methyl-2-pyrrolidone and dimethylsulfone. These are preferably used individually or in combination. The polyamide acid copolymer obtained by the process is prepared in a proportion of from 10 to 30% by weight in the aforementioned solvent.

The polyamide acid copolymer obtained by the process can be converted into polyimide copolymer by cyclization by either chemical ring closure by dehydration using a dehydrating agent and catalyst or thermal ring closure by thermal dehydration. However, chemical ring closure is preferred for increasing the modulus and lowering the thermal expansion coefficient of the polyimide copolymer resin products obtained and for imparting the chemical etching property necessary for TAB use. Examples of the dehydrating agent used in the chemical ring closure include aliphatic acid anhydrides such as acetic anhydride and aromatic acid anhydrides such as phthalic anhydride. These can be used individually or in combination. Examples of catalysts include heterocyclic tertiary amines such as pyridine, picoline and quinoline, aliphatic tertiary amines such as triethylamine and aromatic tertiary amines such as N,N-dimethylaniline. These can be used individually or in mixtures.

The present invention is illustrated by the following examples. In the examples, PPD means p-phenylenediamine, ODA means 4,4'-diaminodiphenyl ether, PMDA means pyromellitic dianhydride, BPDA means 3,3',4,4'-biphenyl-tetracarboxylic dianhydride, BTDA means, 3,3',4,4'-benzophenonetetracarboxylic dianhydride, and DMAC means N,N-dimethylacetamide.

EXAMPLE 1

DMAC (239.1 g) was placed in a 500 ml flask. PPD (1.870 g, 0.0173 mole) and PMDA (3.659 g, 0.0168 mole) of PMDA were added and reacted for 1 hour at ambient temperature and pressure. ODA (25.398 g, 0.1268 mole) was then introduced and stirred until homogeneous. BPDA (8.481 g, 0.0288 mole) was then added and reacted for 1 hour. PMDA (21.491 g, 0.0985 mole) was added next and reacted for 1 hour to form a polyamide acid copolymer solution. The molar ratios of the raw materials used in this polymerization are shown in Table 1. The total weight of the solids fraction was 60.9 g. The polyamide acid copolymer solution (15 g) was spread on a 125 μm thick polyester film. The coated film was then spun for 1 minute at 2500 rpm on a 1H-360S spin coater made by Mikasa. Following imidation by immersion for 10 minutes in a mixed solution of acetic anhydride and β-picoline, the polyimide gel film was peeled away from the polyester film and the gel film was fixed in a support frame. After heat drying for 20 minutes at 300° C., then for 5 minutes at 400° C., the film was removed from the support frame to provide an approximately 25 μm thick polyimide copolymer film. The results of evaluating the properties of this film are shown in Table 1.

The properties were evaluated by the following methods:
(1) Modulus of elasticity
    Apparatus: RTM-250
    Pulling speed: 100 mm/min
    Load: 10 kg
(2) Thermal expansion coefficient
    Apparatus: TMA-50
    Measurement temperature range: 50°–200° C.
    Temperature elevation rate: 10° C./min
(3) Water absorption
The weight gain % in relation to the original weight was evaluated after allowing the samples to stand for 2 days in a desiccator at 98% RH atmosphere.

EXAMPLES 2 TO 10

Polyamide acid copolymer solutions containing aromatic diamine components and aromatic tetracarboxylic acid components in the proportions shown in Table 1 were prepared by the same procedure as described in Example 1. Polyimide copolymer films were prepared by the same procedure as in Example 1 and were evaluated with the results shown in Table 1.

EXAMPLE 11

A polyamide acid copolymer solution was prepared by the same procedure as used in Example I except that BPDA was substituted by BTDA and the amounts of materials added were as shown in Table 1. Polyimide copolymer film was prepared by the same procedure as in Example 1 and was evaluated with the results shown in Table 1.

EXAMPLE 12

DMAC (239.1 g) was placed in a 500 ml flask. PPD and BPDA were added and reacted for I hour at ambient temperature and pressure. ODA was then added and stirred until homogeneous. BPDA was next added and reacted for 1 hour. PMDA was added thereafter and reacted for 1 hour to obtain a polyamide acid copolymer solution. The amounts of each material added in this polymerization were as shown in Table 1. The total solids fraction weight was 60.0 g. The polyimide copolymer film was prepared from the polyamide acid copolymer solution in the same way as described in Example 1. The film was evaluated and the results are shown in Table 1.

COMPARATIVE EXAMPLE 1C

DMAC (239.1 g) was placed in a 500 ml flask. ODA and PMDA were added and reacted for I hour at ambient temperature and pressure to obtain a polyamide acid solution. The molar ratio of ODA and PMDA was 1:1 and the total solids fraction was 60.9 g. Polyimide film was prepared from the polyamide acid solution in the same way as in Example 1. The film was evaluated and the results are shown in Table 2.

COMPARATIVE EXAMPLE 2C

DMAC (239.1 g) was placed in a 500 ml flask. PPD and PMDA were added and reacted for 1 hour at ambient temperature and pressure. ODA was then added and stirred until homogeneous. PMDA was subsequently added and reacted for 1 hour to form a polyamide acid copolymer solution. The amounts of each material added in this polymerization were as shown in Table 2. The total solids fraction weight was 60.9 g. The polyimide copolymer film was prepared from the polyamide acid copolymer solution by the same procedure as Example 1. The film was evaluated and the results are shown in Table 2.

COMPARATIVE EXAMPLE 3C

DMAC (239.1 g) was placed in a 500 ml flask. PPD, ODA, BPDA and PMDA were added in order and reacted for 2 hours at ambient temperature and pressure to form a polyamide acid copolymer solution. The amounts of each material added in this polymerization were as shown in Table 2. The total solids fraction weight was 60.9 g. The polyimide copolymer film was prepared from this polyamide acid copolymer solution by the same procedure as in Example 1. The film was evaluated and the results are shown in Table 2.

TABLE 1

| Example | 1 | 2 | 3 | 4 | 5 | 6 |
| --- | --- | --- | --- | --- | --- | --- |
| Addition order and molar ratio | PPD 12<br>PMDA 11.6 | PPD 12<br>PMDA 11.6 | PPD 12<br>PMDA 11.6 | PPD 12<br>PMDA 11.6 | PPD 20<br>PMDA 19.4 | PPD 20<br>PMDA 20 |

TABLE 1-continued

| Example | 1 | 2 | 3 | 4 | 5 | 6 |
|---|---|---|---|---|---|---|
| | ODA 88 | ODA 88 | ODA 88 | ODA 88 | ODA 80 | ODA 80 |
| | BPDA 20 | BPDA 30 | BPDA 40 | BPDA 50 | BPDA 20 | BPDA 40 |
| | PMDA 68.4 | PMDA 58.4 | PMDA 48.4 | PMDA 38.4 | PMDA 60.6 | PMDA 40 |
| Modulus (kg/mm$^2$) | 488 | 496 | 471 | 516 | 485 | 545 |
| Thermal expansion coefficient (ppm/°C.) | 21.0 | 20.0 | 23.0 | 22.8 | 18.7 | 18.0 |
| Water absorption (%) | 2.2 | 2.0 | 1.7 | 1.6 | 2.4 | 1.8 |
| Example | 7 | 8 | 9 | 10 | 11 | 12 |
| Addition order and molar ratio | PPD 25 | PPD 25 | PPD 30 | PPD 30 | PPD 25 | PPD 25 |
| | PMDA 24.3 | PMDA 24.3 | PMDA 29.1 | PMDA 29.1 | PMDA 24.3 | PMDA 24.3 |
| | ODA 75 | ODA 75 | ODA 70 | ODA 70 | ODA 75 | ODA 75 |
| | BPDA 20 | BPDA 25 | BPDA 20 | BPDA 40 | BTDA 25 | BPDA 9.7 |
| | PMDA 55.7 | PMDA 50.7 | PMDA 50.9 | PMDA 30.9 | PMDA 50.7 | PMDA6 |
| Modulus (Kg/mm$^2$) | 536 | 520 | 561 | 546 | 440 | 463 |
| Thermal expansion coefficient (ppm/°C.) | 17.0 | 16.5 | 12.7 | 13.1 | 16.7 | 18.4 |
| Water absorption (%) | 2.5 | 2.1 | 2.6 | 2.1 | 2.4 | 1.9 |

TABLE 2

| Comparative example | 1C | 2C | 3C |
|---|---|---|---|
| Addition order and molar ratio | ODA 100 | PPD 12 | PPD 25 |
| | PMDA 100 | PMDA 11.6 | PMDA 75 |
| | | ODA 88 | BPDA 25 |
| | | PMDA 88.4 | PMDA 75 |
| Modulus (kg/mm$^2$) | 261 | 392 | 354 |
| Thermal expansion coefficient (ppm/°C.) | 30.7 | 21.6 | 27.9 |
| Water absorption (%) | 2.7 | 2.8 | 2.3 |

What is claimed is:

1. A polyimide copolymer comprising a block polyimide component formed from a rigid aromatic diamine compound and an aromatic tetracarboxylic acid compound and a random polyimide component formed from a flexible aromatic diamine compound and at least two different aromatic tetracarboxylic acid compounds, wherein the rigid aromatic diamine compound comprises from 12 mole % to 30 mole % of the total aromatic diamine compound and wherein the flexible aromatic diamine compound comprises from 70 mole % to 88 mole % of the total aromatic diamine compound.

2. The polyimide copolymer of claim 1 wherein the rigid aromatic diamine compound is a diamine represented by formula (I)

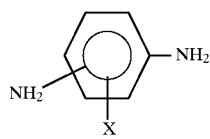
(I)

wherein X is a monovalent substituent selected from hydrogen, halogen, carboxyl, lower alkyl and lower alkoxy groups wherein alkyl or alkoxy contains from 1 to 4 carbon atoms.

3. The polyimide copolymer of claim 2 wherein X is hydrogen.

4. The polyimide copolymer of claim 3 wherein the rigid aromatic diamine compound is p-phenylenediamine.

5. The polyimide copolymer of claim 1 wherein the flexible aromatic diamine compound is a diamine represented by formula (II)

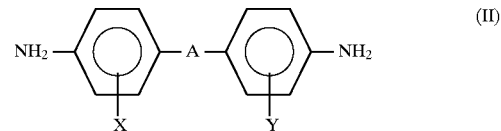
(II)

wherein X and Y are monovalent substituents selected from hydrogen, halogen, carboxyl, lower alkyl and lower alkoxy groups, X and Y may be the same or different substituents and A is a bivalent connecting group selected from —O—, —S—, —CO—, —SO—, —SO$_2$— and —CH$_2$— wherein alkyl or alkoxy contains from 1 to 4 carbon atoms.

6. The polyimide copolymer of claim 5 wherein the flexible aromatic diamine compound is a diamine represented by formula (III)

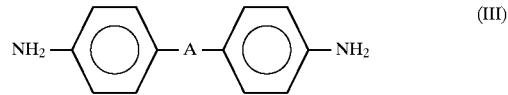
(III)

wherein A is a bivalent connecting group selected from —O—, —S—, —CO—, —SO—, —SO$_2$— and —CH$_2$—.

7. The polyimide copolymer of claim 6 wherein the flexible aromatic diamine compound is 4,4'-diaminodiphenyl ether.

8. The polyimide copolymer of claim 1 wherein the aromatic tetracarboxylic acid compound comprises pyromellitic acid or dianhydride, 3,3',4,4'-biphenyltetracarboxylic acid or dianhydride or 3,3',4,4'-benzophenonetetracarboxylic acid or dianhydride.

9. The polyimide copolymer of claim 8 wherein the pyromellitic acid or dianhydride comprises from 50 mole % to 80 mole % of the total aromatic tetracarboxylic acid component and the 3,3',4,4'-biphenyltetracarboxylic acid or dianhydride and/or 3,3',4,4'-benzophenonetetracarboxylic acid or dianhydride comprise from 20 mole % to 50 mole % of the total aromatic tetracarboxylic acid component.

10. A process for preparing a polyimide copolymer comprising (1) mixing a rigid aromatic diamine compound and an aromatic tetracarboxylic acid compound in an organic solvent that is nonreactive to the reactants so that the ratio of the aromatic tetracarboxylic acid compound to the rigid aromatic diamine compound is from 90 mole % to not more than 100 mole %; (2) adding a flexible aromatic diamine compound; (3) adding an aromatic tetracarboxylic acid compound (A) and a aromatic tetracarboxylic acid compound (B; A≠B) in such a quantity that the total aromatic tetracarboxylic acid component and the total aromatic diamine component are equimolar and stirring for a time necessary for completion of the reaction; and (4) cyclizing and removing the solvent from the polyamide acid copolymer solution.

11. The process for preparing the polyimide copolymer of claim 10 wherein the cyclization is conducted by chemical cyclization using a cyclization catalyst and a dehydrating agent.

12. A polyimide copolymer resin molded product prepared by molding a polyimide copolymer comprising a block polyimide component comprising a rigid aromatic diamine compound and an aromatic tetracarboxylic acid compound and a random polyimide copolymer component comprising a flexible aromatic diamine compound and at least two different aromatic tetracarboxylic acid compounds.

13. The polyimide copolymer resin molded product of claim 12 wherein the molded product is a film.

14. A process for preparing a polyimide copolymer resin molded product comprising (1) mixing a rigid aromatic diamine compound and an aromatic tetracarboxylic acid compound in an organic solvent that is nonreactive to the reactants so that the ratio of aromatic tetracarboxylic acid compound to the rigid aromatic diamine compound is from 90 mole % to not more than 100 mole %; (2) adding a flexible aromatic diamine compound; (3) adding an aromatic tetracarboxylic acid compound (A) and adding an aromatic tetracarboxylic acid compound (B; A≠B) in such a quantity that the total aromatic tetracarboxylic acid component and total aromatic diamine component are equimolar and stirring for a time necessary for completion of the reaction; and (4) cyclizing and removing the solvent after molding the polyamide acid copolymer solution.

15. The process for preparing the polyimide copolymer resin molded product of claim 14 wherein the molded product is a film.

16. The process for preparing the polyimide copolymer resin molded product of claim 15 wherein cyclization is conducted by chemical cyclization using a cyclization catalyst and a dehydrating agent.

17. The polyimide copolymer of claim 1 comprising a block polyimide component formed from pyromellitic dianhydride and p-phenylenediamine and a random polyimide copolymer component formed from pyromellitic dianhydride, 3,3',4,4'-biphenyltetracarboxylic dianhydride and 4,4'-diaminodiphenyl ether.

18. The polyimide copolymer of claim 1 comprising a block polyimide component formed from pyromellitic dianhydride and p-phenylenediamine and a random polyimide copolymer component formed from pyromellitic dianhydride, 3,3',4,4'-benzophenonetetracarboxylic dianhydride and 4,4'-diaminodiphenyl ether.

* * * * *